(12) United States Patent
Shimoda

(10) Patent No.: US 6,452,279 B2
(45) Date of Patent: Sep. 17, 2002

(54) SEMICONDUCTOR DEVICE

(75) Inventor: Masaki Shimoda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/771,891

(22) Filed: Jan. 30, 2001

(30) Foreign Application Priority Data

Jul. 14, 2000 (JP) ......................................... 2000-214456

(51) Int. Cl.[7] .......................... H01L 29/40; H01L 23/02
(52) U.S. Cl. ...................... 257/777; 257/685; 257/686; 257/784
(58) Field of Search .............................. 257/685, 686, 257/777, 781, 784, 693

(56) References Cited

U.S. PATENT DOCUMENTS 5,998,864 A  * 12/1999  Khandros et al. ............ 257/723

FOREIGN PATENT DOCUMENTS

| JP | 57-31166 | * | 2/1982 | .................. 257/686 |
| JP | 58-92230 | * | 6/1983 | .................. 257/686 |
| JP | 59-127856 | * | 7/1984 | .................. 257/686 |
| JP | 03-255657 |   | 11/1991 | |
| JP | 05-090486 |   | 4/1993 | |
| JP | 06-177322 |   | 6/1994 | |

* cited by examiner

*Primary Examiner*—Jasmine J B Clark
(74) *Attorney, Agent, or Firm*—McDermott, Will & Emery

(57) ABSTRACT

A semiconductor device with more scale reduction and without restriction of arrangement of connection pads for preventing them from being covered is obtained. The semiconductor device has first and second semiconductor chips stacked on a substrate, wherein a connection pad of the first semiconductor chip faces the substrate, and the first and second semiconductor chips are both connected to input/output terminals of the substrate by means of wires.

9 Claims, 3 Drawing Sheets

SEMICONDUCTOR DEVICE

BACKGROUND OF THE INVENTION

1. Field of the Invention

The present invention relates to a semiconductor device having stacked semiconductor chips mounted on a substrate.

2. Description of the Background Art

For convenience to users and scale reduction of semiconductor devices, a semiconductor device has been used in which two semiconductor chips are housed in one CSP (chip scale package). Referring to FIGS. 4A and 4B, in a conventional CSP, the first semiconductor chip 101 and the second semiconductor chip 102 are stacked with a shift so that one semiconductor chip may not cover the connection pads (not illustrated) disposed on the other semiconductor chip. This stack is fixed with an insulating adhesive layer 108. The semiconductor chips 101, 102 are connected to an input/output terminal 104 disposed on the front surface of a glass epoxy substrate 105 with the use of a gold wire 106, and the whole is sealed with an epoxy resin 107. A solder ball 109 is provided on the rear surface side of the glass epoxy substrate 105, and the semiconductor device is connected to another device via this solder ball.

However, since the above-mentioned two semiconductor chips 101, 102 are disposed in a shifted configuration so that one may not cover the connection pad of the other, there has been an inconvenience such that the arrangement of the connection pad particularly of the semiconductor chip disposed on the lowermost part is restricted. For example, in the case of a semiconductor device in which two semiconductor chips of 64 M-DRAM (dynamic random access memory) are mounted in a CSP, this inconvenience is conspicuous. In other words, although they are semiconductor chips having the same shape, the upper semiconductor chip must be shifted so as to avoid the connection pad disposed on the lower semiconductor chip (semiconductor chip placed on the lower side). For this reason, the scale reduction of the package is inhibited in a fundamental part.

Here, the terms "upper" and "lower" are used to mean that, in two semiconductor chips stacked on a substrate, the lower semiconductor chip is disposed nearer to the substrate and the upper semiconductor chip is disposed farther to the substrate. Further, a downward oriented semiconductor chip refers to a semiconductor chip whose connection pad faces the substrate, and the upward oriented semiconductor chip refers to a semiconductor chip whose connection pad faces away from the substrate.

High integration and scale reduction of semiconductor devices is constantly sought for, and a higher degree of integration and scale reduction is desired with a simple production process. In other words, it is always desired to develop, with a simple production process, a semiconductor device whose degree of scale reduction exceeds that of a previous semiconductor device even only a little.

Further, as noted before, in stacking semiconductor chips, it is desired that no restriction is imposed such as the arrangement in which one semiconductor chip does not cover the connection pad of the other semiconductor chip. In other words, it is desired to provide a convenient arrangement for improvement of frequency characteristics and electric characteristics and for scale reduction without the above-mentioned restriction.

SUMMARY OF THE INVENTION

The first object of the present invention is to provide a packaged semiconductor device having a high degree of integration with a more reduced scale. Further, the second object of the present invention is to avoid the restriction of the arrangement of the connection pads which is imposed for preventing the connection pads of one semiconductor device from being covered with the other semiconductor chip.

A semiconductor device according to the first aspect of the present invention has two or more semiconductor chips including first and second semiconductor chips stacked on a substrate, wherein a connection pad of the first semiconductor chip faces the substrate, and the first and second semiconductor chips are both connected to input/output terminals of the substrate by means of wires.

According to the above-mentioned construction, the downward oriented first semiconductor chip is wired in a BOC (board on chip) manner, and if the second semiconductor chip is upward oriented, the second semiconductor chip is wired in a FBGA (fine ball grid array) manner, thereby to be respectively connected to an input/output terminal of the substrate. In this construction, if the second semiconductor chip is upward oriented and stacked adjacent to the first semiconductor chip, the two semiconductor chips are in a back-to-back configuration, thereby eliminating the possibility that the connection pad of one semiconductor chip is covered (hidden) by the other semiconductor chip, so that there is no restriction imposed on the arrangement of the connection pads. Therefore, the arrangement of the connection pads can be designed taking the chip size, the frequency characteristics, and the electrical characteristics into account. Moreover, the two semiconductor chips can be stacked back-to-back in exact alignment, and in this case, scale reduction is achieved in the semiconductor device.

Furthermore, since the aforementioned semiconductor device can be connected simply by a wiring and mounted, the production process will be simplified, and it is desirable in some cases.

In the aforesaid semiconductor device according to the first aspect of the present invention, a lowermost semiconductor chip which is the nearest to the substrate is the first semiconductor chip, and the lowermost semiconductor chip is connected to an input/output terminal on a rear surface side of the substrate by means of a wire that passes through a through-hole formed in the substrate.

By this construction, the connection pad of the lower semiconductor chip disposed on the front surface of the substrate is connected to the input/output terminal on the rear surface of the substrate by means of a wiring, and if the upper semiconductor chip is upward oriented, it is wired to an input/output terminal on the front surface of the substrate. The aforementioned two semiconductor chips can be disposed back to back, and in this case, no restriction will be imposed on the arrangement of the connection pads in the semiconductor chip. Furthermore, since the two semiconductor chips need not be shifted from each other, the scale is reduced. Here, the front surface of the substrate refers to the surface on the side where the semiconductor chips are mounted, and the rear surface of the substrate refers to the surface on the side opposite to the front surface of the substrate.

In the semiconductor device according to the first aspect of the present invention, the second semiconductor chip is stacked adjacent to the first semiconductor chip, and has a connection pad that is positioned to face away from the substrate.

By this construction, the connection pad of the downward oriented semiconductor chip on the lower side is connected to the input/output terminal on the rear surface of the substrate by means of a wiring, and the upward oriented semiconductor chip on the upper side is wired to the input/output terminal on the front surface of the substrate. Since the aforementioned two semiconductor chips are disposed back to back, no restriction is imposed on the arrangement of the connection pads in the semiconductor chip. Furthermore, since the two semiconductor chips need not be shifted from each other, the scale is reduced.

In the semiconductor device according to the first aspect of the present invention, at least two semiconductor chips out of the two or more semiconductor chips have the same size.

By this construction, the two semiconductor chips are stacked back to back in exact alignment, so that the scale reduction of the semiconductor device is achieved. The degree of scale reduction will be particularly conspicuous in the case where three or more semiconductor chips are stacked.

A semiconductor device according to the second aspect of the present invention has a semiconductor chip in a laminated state in which two or more semiconductor chips are stacked on a substrate, wherein first and second semiconductor chips are stacked adjacent to each other in an up-and-down direction, and connection pads of the first and second semiconductor chips both face the substrate.

(a) By this construction, the first and second semiconductor chips can both be connected to input/output terminals on the substrate, for example, by means of inner bumps that are electrically conducted to the connection pads thereof. Therefore, the semiconductor chips can be connected without the use of a gold wire, so that there is no need to ensure wide peripheries on the substrate for providing the space where the gold wires are to be extended. For this reason, the scale reduction is promoted to that extent. However, since the two semiconductor chips are oriented in the same direction, the two semiconductor chips must be shifted from each other so that the connection pads may not be covered, whereby the scale will be increased to that extent. However, this increase in the scale is cancelled with the aforesaid omission of the space for the wires, so that a sufficient scale reduction can be achieved in the end.

If the connection is established by means of the inner bumps alone, there is no need to use expensive gold wires, thereby reducing the costs and simplifying the production process.

(b) On the other hand, if the first semiconductor chip located on the lower side is connected to the input/output terminal on the rear surface of the substrate by means of a wiring that passes through the through-hole of the substrate, the second semiconductor chip located thereon can be connected to the input/output terminal on the front surface of the substrate by means of an inner bump. The semiconductor chip connected by a wiring and the semiconductor chip connected by an inner bump can be exchanged from each other. In the aforesaid arrangement (b), there is no need to ensure a space in the peripheries for extending gold wires, so that a sufficient scale reduction can be achieved in the same manner as the arrangement (a) where the two semiconductor chips are both connected by inner bumps.

(c) Furthermore, there are some cases in which the two semiconductor chips are both connected to the input/output terminals on the rear surface side by means of a wiring that passes through a through-hole formed in the substrate. In this case also, the wiring is passed from the downward oriented connection pad towards the downward oriented through-hole, so that there is not need to ensure a large space for wiring, unlike a wiring extended from an upward oriented connection pad. Therefore, a sufficient scale reduction can be achieved.

If three or more semiconductor chips are to be stacked in the aforementioned cases of (a), (b), and (c), the aforesaid first and second semiconductor chips are disposed as two lower semiconductor chips, and the rest of the semiconductor chips are stacked so that the connection pads thereof are oriented in an opposite direction. As a result, a great scale reduction can be achieved in a semiconductor device in which three or more semiconductor chips are stacked.

In the semiconductor device according to the second aspect of the present invention, the first semiconductor chip is a lowermost semiconductor chip which is the nearest to the substrate, and the second semiconductor chip is positioned thereon.

In the above-mentioned construction, the first semiconductor chip is disposed in a downward direction and the second semiconductor chip is disposed thereon also in a downward direction. At this time, there may be (a) a case in which the upper and lower semiconductor chips are both connected by means of inner bumps, (b) a case in which the lower semiconductor chip is connected to the rear surface of the substrate by means of a wiring, and the upper semiconductor chip is connected to the front surface of the substrate by means of an inner bump, and the opposite case, and (c) a case in which the upper and lower semiconductor chips are both connected to the rear surface of the substrate by means of wires. As described above, scale reduction corresponding to each case can be achieved.

In the semiconductor device according to the second aspect of the present invention, the first and second semiconductor chips are both connected to an input/output terminal on a front surface side of the substrate by means of inner bumps.

This construction corresponds to the aforesaid case (a), and the same effects as in the case (a) are produced.

In the semiconductor device according to the second aspect of the present invention, the first and second semiconductor chips are both connected to an input/output terminal on a rear surface side of the substrate by means of a wire that passes through a through-hole formed in the substrate.

This construction corresponds to the aforesaid case (c). In this construction (c), since the connection pad of the upper semiconductor chip faces the substrate, the gold wire constituting the wiring passes linearly through the through-hole, so that there is no need to provide a large space for extending the gold wire. Therefore, there is no need to provide a large space for gold wires on the peripheries of the substrate, whereby the scale is reduced to that extent. This semiconductor device has a larger scale due to the shift of the semiconductor chips for preventing the connection pads from being covered; however, the scale is reduced by the amount of the wires, so that a sufficient scale reduction is achieved in the end.

In the semiconductor device according to the second aspect of the present invention, either one of the first and second semiconductor chips is connected to an input/output terminal on a front surface side of the substrate by means of an inner bump, and the other is connected to an input/output terminal on a rear surface side of the substrate by means of a wire that passes through a through-hole formed in the substrate.

In the above-mentioned construction, the connection by a wiring is established by connection through the through-hole formed in the substrate to the input/output terminal on the rear surface of the substrate, and the connection by an inner bump is established by connection to the input/output terminal on the front surface of the substrate. In this case, the space for the wiring extended from the upward oriented connection pad can be omitted, so that a sufficient scale reduction can be achieved as described above.

In the semiconductor device according to the second aspect of the present invention, at least two semiconductor chips out of the two or more semiconductor chips have the same size.

As described above, even in the case where two semiconductor chips are mounted, the two semiconductor chips can be disposed in a planarly shifted configuration so that the connection pad of the upper semiconductor chip may not be covered with the lower semiconductor chip. In this arrangement, the semiconductor device will have a larger scale due to the planar shift. However, as described above, there is no need to provide larger peripheries of the substrate than in the case where an upward oriented upper semiconductor chip is connected by means of a wiring in a conventional semiconductor device in which the same semiconductor chips are stacked onto one another. For this reason, the two are cancelled, and a sufficient scale reduction can be achieved in the end.

In the case where three or four semiconductor chips are to be mounted, the same semiconductor chips as the lower two downward oriented semiconductor chips can be mounted thereon in an upward direction. In this case, the upper semiconductor chips can be mounted without increasing the area planarly occupied by the lower two semiconductor chips. As a result of this, a great scale reduction can be achieved.

The foregoing and other objects, features, aspects, and advantages of the present invention will become more apparent from the following detailed description of the present invention when taken in conjunction with the accompanying drawings.

BRIEF DESCRIPTION OF THE DRAWINGS

FIG. 4A is a perspective view showing an LSI chip partially exposed from a sealing resin, and FIG. 4B is a cross section view of the conventional semiconductor device.

DESCRIPTION OF THE PREFERRED EMBODIMENTS

Hereafter, preferred embodiments of the present invention will be described with reference to the attached drawings.
(First Embodiment)

Figure 1:
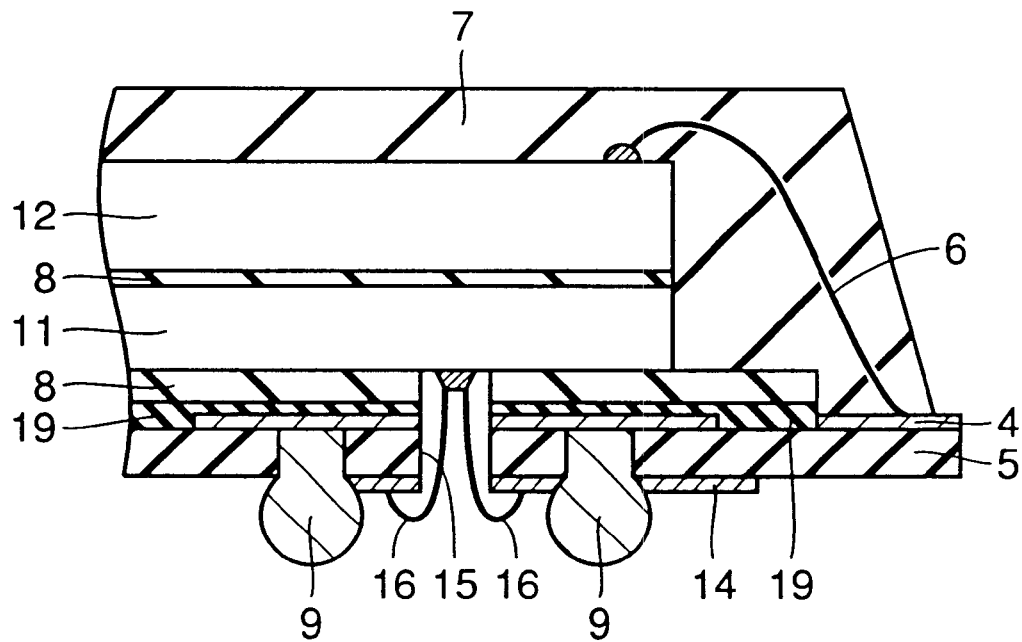
FIG. 1 is a cross section view of a semiconductor device according to a first embodiment of the present invention.

Referring to FIG. 1, two LSI chips 11, 12 are mounted in a CSP. The LSI chip 11 located on the lower side is disposed in such a manner that its connection pad (not illustrated) faces a glass epoxy substrate 5 on which a metal wiring 4 serving as an input/output terminal is disposed. The connection pad of the LSI chip 11 is connected to a metal wiring 14 serving as an input/output terminal disposed on the rear surface side of the glass epoxy substrate by means of a gold wire 16 that passes through a through-hole 15 of the glass epoxy substrate 5. The metal wiring 14 serving as an input/output terminal disposed on the rear surface side of the glass epoxy substrate 5 as well as the metal wiring 4 serving as an input/output terminal disposed on the front surface side of the glass epoxy substrate 5 are electrically conducted to a solder ball 9.

On the other hand, the LSI chip 12 is bonded to a rear surface of the LSI chip 11 by means of a dielectric layer (insulating layer) serving as an adhesive in a back-to-back configuration in which the rear surfaces of the two LSI chips 11, 12 face each other. The connection pad of the LSI chip 12 is connected to the metal wiring 4 serving as an input/output terminal on the front surface of the glass epoxy substrate 5 by means of a gold wire 6.

According to this construction, the two LSI chips in a back-to-back configuration do not require an arrangement for preventing the connection pads from being covered, whereby an arrangement for improving the frequency characteristics and electrical characteristics and achieving the scale reduction can be promoted. Furthermore, the two LSI chips are identical LSI chips and stacked in exact alignment, so that the scale reduction can be strongly promoted.
(Second Embodiment)

Figure 2:
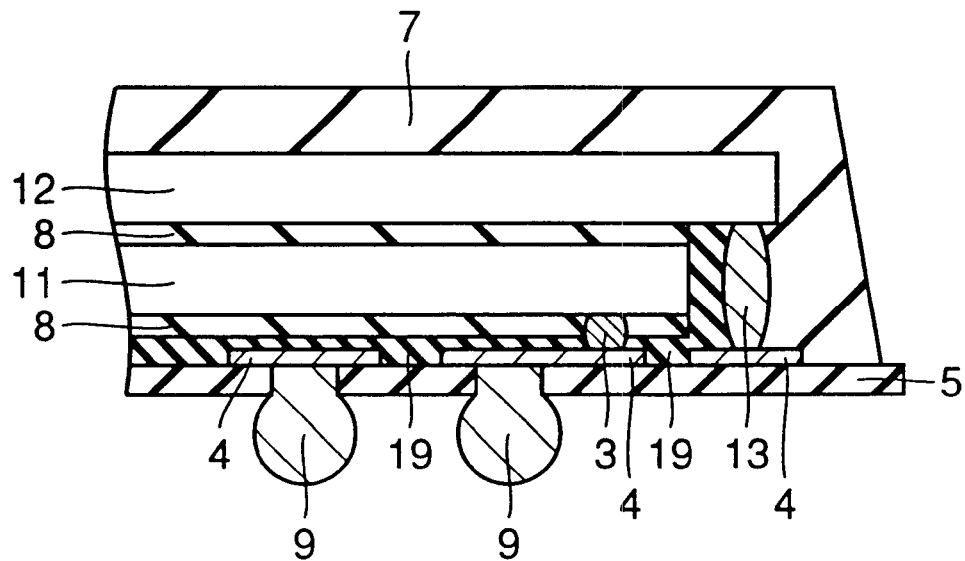
FIG. 2 is a cross section view of a semiconductor device according to a second embodiment of the present invention.

Referring to FIG. 2, this package includes two LSI chips mounted in a CSP. The LSI chip 11 located on the lower side is disposed in such a manner that its connection pad (not illustrated) faces a glass epoxy substrate 5 on which a metal wiring 4 serving as an input/output terminal is disposed. Further, the LSI chip 12 located thereon is likewise disposed in such a manner that its connection pad (not illustrated) faces the glass epoxy substrate 5. The connection pad of the LSI chip 11 on the lower side is connected to the metal wiring 4 by means of an inner bump 3. The metal wiring disposed on the glass epoxy substrate is connected to a solder ball 9. On the other hand, the LSI chip 12 is fixed onto the LSI chip 11 via a dielectric layer 8 serving as an adhesive. The LSI chip 12 is connected to the metal wiring 4 by means of an inner bump 13.

In the aforementioned semiconductor device, the LSI chip on the upper side need not be connected by means of a gold wire to the metal wiring disposed on the glass epoxy substrate. For this reason, the peripheries of the glass epoxy substrate need not be provided in a large width for arrangement of the gold wire. Therefore, even if the aforesaid two LSI chips are identical LSI chips and the upper and lower LSI chips must be disposed with a shift, the package size can be reduced more than that.
(Third Embodiment)

Figure 3:
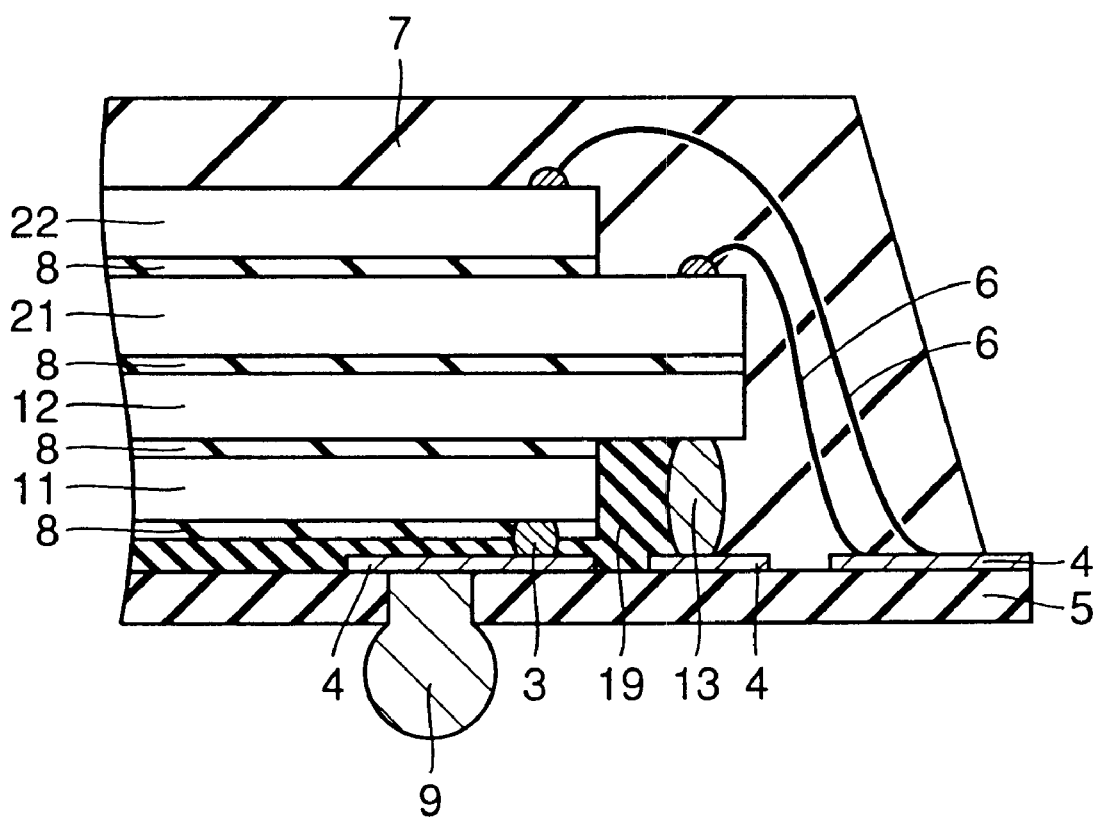
FIG. 3 is a cross section view of a semiconductor device according to a third embodiment of the present invention.
Figure 4A:
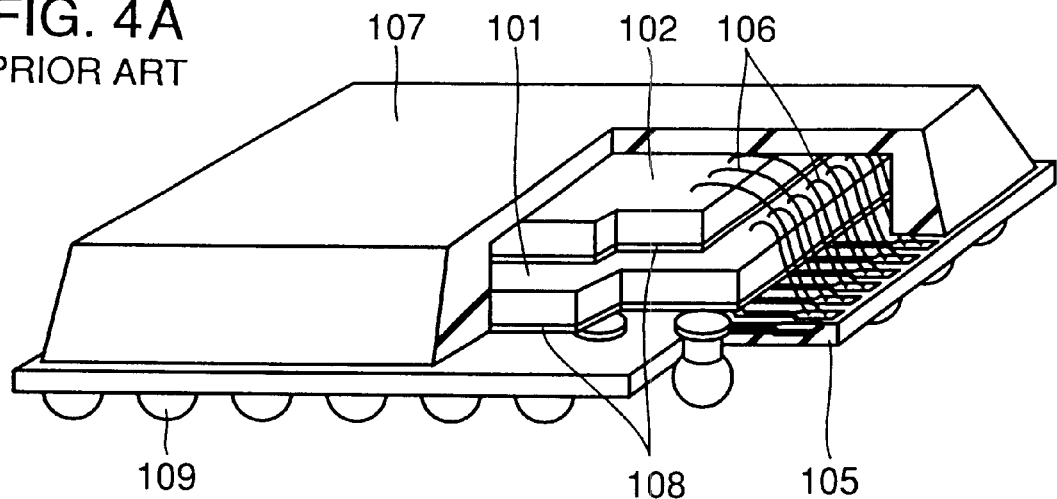
FIGS. 4A and 4B are views for describing a conventional semiconductor device, where
Figure 4B:
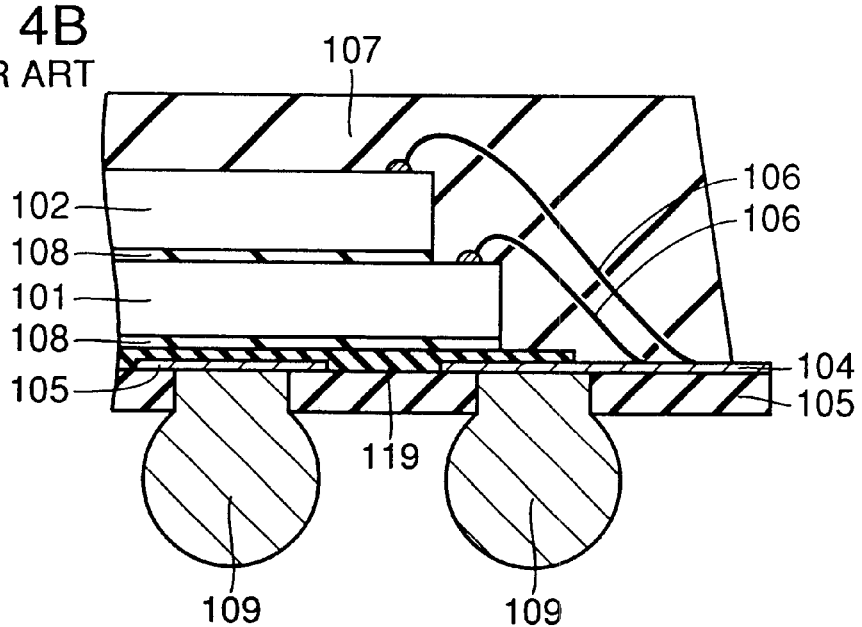

Referring to FIG. 3, the two LSI chips 11, 12 on the lower side are disposed in a planarly shifted position with each other so that the connection pads (not illustrated) may not be covered. The two LSI chips 21, 22 on the upper side are likewise disposed in a planarly shifted position with each other so that the connection pads may not be covered. Further, the two LSI chips 11, 12 on the lower side are connected to a metal wiring 4 by means of inner bumps 3, 13, respectively. On the other hand, the two LSI chips 21, 22 on the upper side are connected to the metal wiring 4 by means of a gold wire 6. Restriction of arrangement of connection pads is imposed between the two LSI chips 11, 12 on the upper side and between the two LSI chips 21, 22 on the lower side. However, the package size can be reduced to a great extent as compared with a conventional case by disposing the identical LSI chips on the upper side and on the lower side so that the arrangement of the two on the lower side and the two on the upper side will be mirror-symmetric with respect to a mirror surface being a boundary surface between the upper side and the lower side. In the aforementioned semiconductor device in which the two LSI chips are both disposed to face downward while being adjacent to each other in an up-and-down direction, a great scale reduction can be achieved in the case in which three or more LSI chips are stacked as mentioned above.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising two or more semiconductor chips including first and second semiconductor chips stacked on a substrate, wherein a connection pad of said first semiconductor chip faces said substrate, and said first and second semiconductor chips are both connected to input/output terminals of said substrate by means of wires.

2. The semiconductor device according to claim 1, wherein a lowermost semiconductor chip which is the nearest to said substrate is said first semiconductor chip, and said lowermost semiconductor chip is connected to an input/output terminal on a rear surface side of said substrate by means of a wire that passes through a through-hole formed in said substrate.

3. The semiconductor device according to claim 1, wherein said second semiconductor chip is stacked adjacent to said first semiconductor chip, and has a connection pad that is positioned to face away from said substrate.

4. The semiconductor device according to claim 1, wherein at least two semiconductor chips out of said two or more semiconductor chips have a same size.

5. A semiconductor device comprising a semiconductor chip in a laminated state in which two or more semiconductor chips are stacked on a substrate, wherein first and second semiconductor chips are stacked adjacent to each other in an up-and-down direction, and connection pads of said first and second semiconductor chips both face the substrate, and said first and second semiconductor chips are both connected to substantially coplanar input/output terminals on a front surface side of said substrate by means of inner bumps.

6. The semiconductor device according to claim 5, wherein said first semiconductor chip is a lowermost semiconductor chip which is the nearest to said substrate, and said second semiconductor chip is positioned thereon.

7. A semiconductor device comprising a semiconductor chip in a laminated state in which two or more semiconductor chips are stacked on a substrate, wherein first and second semiconductor chips are stacked adjacent to each other in an up-and-down direction, and connection pads of said first and second semiconductor chips both face the substrate, and said first and second semiconductor chips are both connected to an input/output terminal on a rear surface side of said substrate by means of a wire that passes through a through-hole formed in said substrate.

8. A semiconductor device comprising a semiconductor chip in a laminated state in which two or more semiconductor chips are stacked on a substrate, wherein first and second semiconductor chips are stacked adjacent to each other in a up-and-down direction, and connection pads of said first and second semiconductor chips both face the substrate, and either one of said first and second semiconductor chips is connected to an input/output terminal on a front surface side of said substrate by means of an inner bump, and the other is connected to an input/output terminal on a rear surface side of said substrate by means of a wire that passes through a through-hole formed in said substrate.

9. A semiconductor device comprising a semiconductor chip in a laminated state in which two or more semiconductor chips are stacked on a substrate, wherein first and state semiconductor chips are stacked adjacent to each other in an up-and-down direction, and connection pads of said first and second semiconductor chips both face the substrate, and at least two semiconductor chips out of said two or more semiconductor chips have a same size.

* * * * *